United States Patent [19]

Mason et al.

[11] Patent Number: 4,584,460
[45] Date of Patent: Apr. 22, 1986

[54] FUSED EYELETTING MACHINE

[75] Inventors: Bobby L. Mason, Alexandria, Va.; Hubert E. Bush, Sykesville, Md.

[73] Assignee: Pace Incorporated, Laurel, Md.

[21] Appl. No.: 583,219

[22] Filed: Feb. 24, 1984

[51] Int. Cl.⁴ .............................................. H05B 1/00
[52] U.S. Cl. .............................. 219/150 V; 219/86.51
[58] Field of Search ......................... 219/150 V, 86.51

[56] References Cited

U.S. PATENT DOCUMENTS

| | | | |
|---|---|---|---|
| 2,578,835 | 12/1951 | Pityo et al. | 219/90 |
| 3,739,141 | 6/1973 | Siegel | 219/150 V |
| 4,460,817 | 7/1984 | Tani et al. | 219/85 D |

Primary Examiner—C. L. Albritton
Assistant Examiner—Alfred S. Keve
Attorney, Agent, or Firm—Gerald J. Ferguson, Jr.

[57] ABSTRACT

A portable machine is disclosed for setting eyelets and the like in printed circuit boards and includes an upper tool connected to a mandrel mounted in a frame and movable into and out of engagement with a lower tool by a toggle means. The lower tool is resiliently mounted in the frame beneath the upper tool and has a support structure beneath it which includes a slidable pressure control means for predetermining the maximum setting pressure applied to a workpiece by the upper and lower tools.

8 Claims, 5 Drawing Figures

FUSED EYELETTING MACHINE

BACKGROUND OF THE INVENTION

This invention relates to an eyeletting machine and more particularly to a manually actuated fused eyeletting machine capable of cold and fused setting of eyelets and funnelets to printed circuit boards.

This invention constitutes an improvement over the fused eyeletting machine disclosed by U.S. Pat. No. 3,739,141 issued June 12, 1973 which is incorporated herein by reference. That machine employed an upper tool and a resilient support structure for the lower tool and its mount which included a rocker arm pivoted to the frame with the mount being seated against one end portion of the rocker arm and an adjustable spring bias means bearing against the other end portion of the rocker arm. Adjustment of the spring bias means acted through pivotal movement of the rocker arm to thereby predetermine the maximum setting pressure applied to a workpiece by the opposed upper and lower tools.

One of the major disadvantages of this structure for setting the pressure is that there is no means or provision for resetting the support structure to a previously determined pressure for various size eyelets thus eliminating the necessity of relying on the "trial and error" method of setting the pressure each time it is desired or necessary to change the size of the eyelet.

It is therefore the primary object of the present invention to provide a superior machine capable of use with equal facility on eyelets and funnelets of different sizes and on printed circuit boards of different thicknesses.

It is another object of the present invention to provide an eyeletting machine which utilizes a novel and simplified support structure for resiliently biasing the lower tool to exert a predetermined force against which the upper tool acts during the setting operation of eyelets and the like.

It is a still further object of the present invention to provide an eyeletting machine which gives a visual indication of the amount of predetermined force selected to be exerted for each specific size eyelet encountered so that the machine can be easily and rapidly reset to exert this predetermined whenever desired.

It is yet another object of this invention to provide a balanced machine usable alternatively upright or on its back.

Further objects and advantages will be apparent from the detailed description of the invention which will be best understood by the following description read in conjunction with the attached drawings wherein.

DETAILED DESCRIPTION

Figure 1:
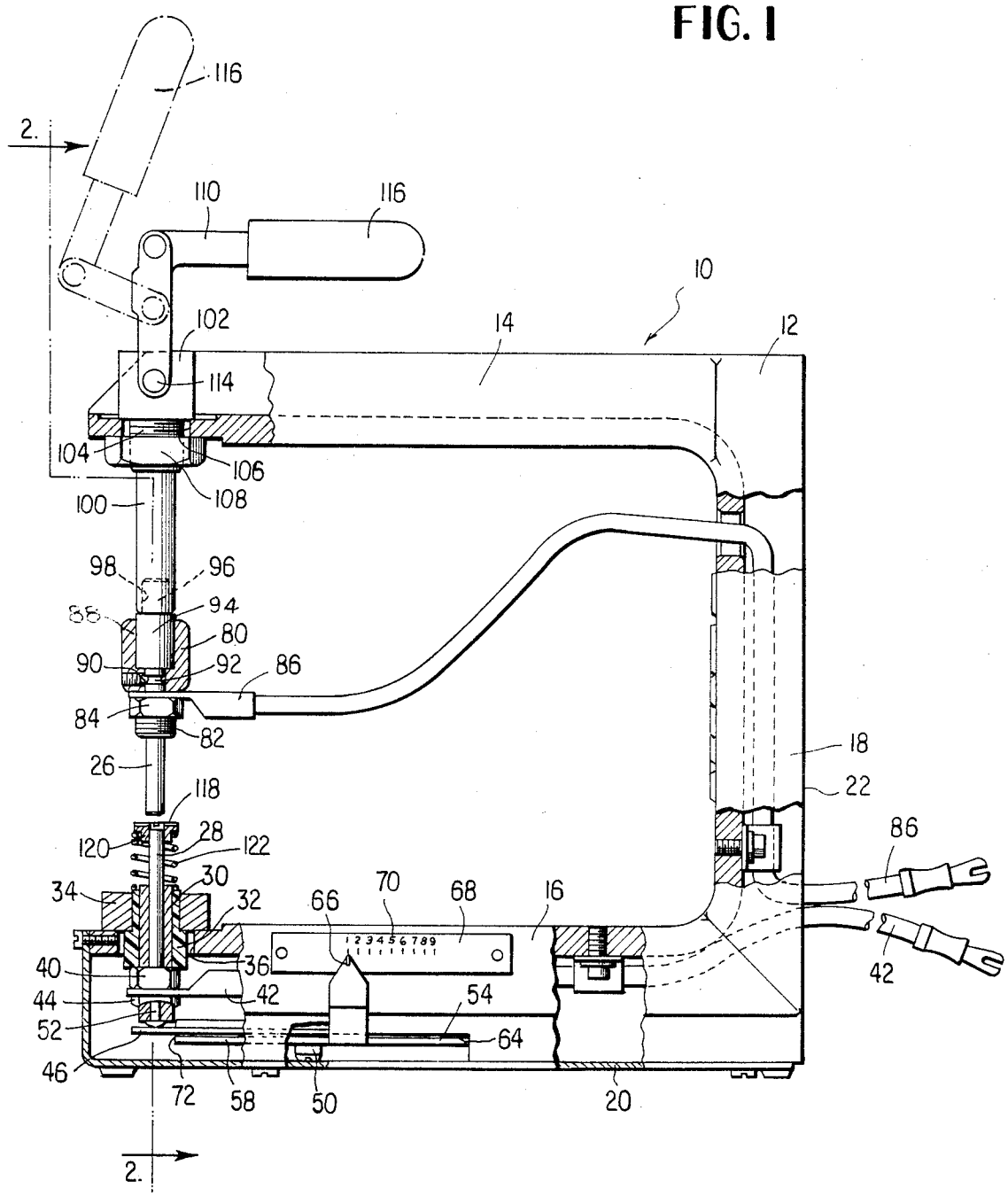
FIG. 1 is a side elevational view in partial cross-section of the machine of the present invention.

As may be seen from FIG. 1, the machine 10 for setting eyelets and the like has a C-shaped frame 12 which suitably is a cast member. The frame has opposing upper and lower arms 14, 16 connected by a back section 18. The lower arm 16 and back section 18 each have a flat outer surface 20, 22, respectively, which enables the machine to be positioned on a work table or the like on either surface 20, 22. Flanges may also be provided on back section 18 to enable it to be secured to the aforementioned work table.

Mounted on the opposing upper and lower arms 14, 16 of the frame 12 is an upper tool 26 and a lower tool 28, each tool being removably located in a suitable support structure as herein after explained. The lower tool 28 is positioned inside a cylindrical support member 30 which together with an annular insulator bushing 32 are press fitted in a plate 34. The plate 34 is mounted over a cylindrical passage 36 in the lower arm 16 of frame 12 by bolts 38 such that the insulator bushing 32 and support member 30 extend through the cylindrical passage 36. The lower support member 30 has adjacent its lower end a threaded section having a nut 40 thereon. An electrical cable 42 is secured on the threaded section by another nut 44. As can be seen, therefore, the principal purpose of the annular insulator bushing 32 is to electrically insulate cable 42 from plate 34 and frame 12. Lower tool support member 30 is free to slide up or down inside bushing 32 as force is exerted on lower tool 28.

Figure 3:
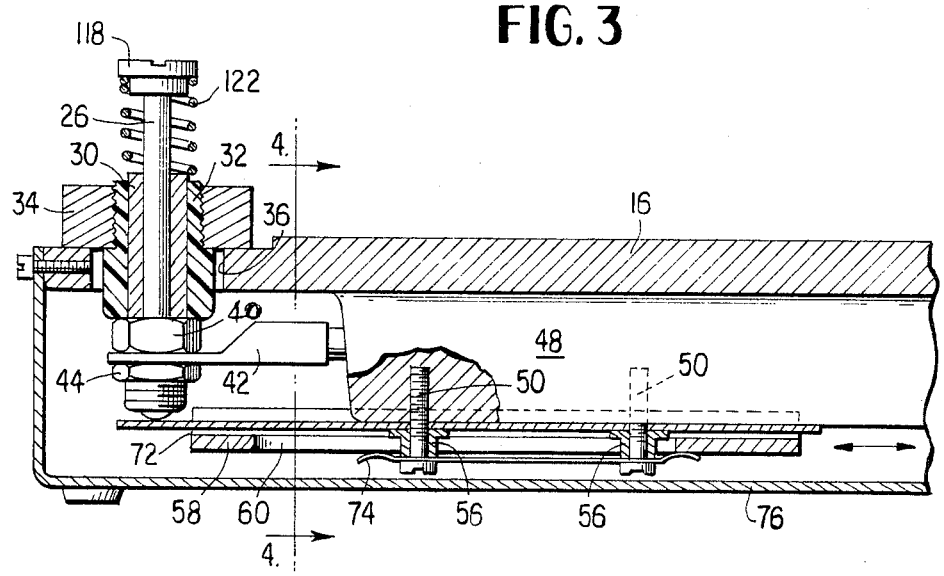
FIG. 3 is a cross-sectional view taken along the lines 3—3 of FIG. 2.
Figure 4:
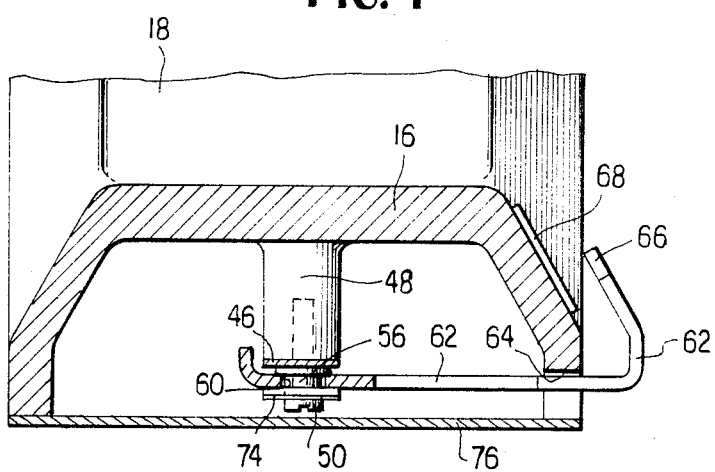
FIG. 4 is a cross-sectional view taken along the lines 4—4 of FIG. 3.

As can best be seen by referring to FIGS. 1, 3 and 4, lower tool support member 30 resiliently rests on one end of a leaf spring 46 which is secured to a projection 48 in lower arm 16 by bolts 50. The leaf spring 46 is electrically insulated from support member 30 by means of a plastic button 52 mounted in the end thereof. The setting pressure applied during operation of the machine 10 forces tool 28 and its support 30 downward inside insulator bushing 32 against leaf spring 46 causing it to flex downward. In order to vary the upward biasing force exerted by the leaf spring 46, a pressure control member 54 is slidably mounted beneath the leaf spring 46 on collars 56 which are held by bolts 50. The control member 54 has a longitudinally extending portion 58 with a slot 60 formed therein in which collars 56 reside and a curved portion 62 which extends out of recess 64 formed in frame 12. The curved portion 62 terminates in a pointer or pointed end 66. A plate 68 with graduated indicia 70 in the form of numerals thereon is secured to the lower arm 16 opposite the pointer 66. The edge 72 of the control member 54 serves as a movable fulcrum or pivot point which the leaf spring 46 will abut during its downward travel. As can be readily seen, as the pivot point is moved to its extreme left position as shown in FIG. 1 with the pointer 66 beneath numeral 1, the pivot point 72 of control member 54 will engage the leaf spring 46 at a point which causes the leaf spring 46 to flex through a short distance to exert maximum upward force on support member 30 via the insulator button 52 as it is pushed downward. Conversely, as the pointer 66 is moved to the right as viewed in FIG. 1 toward the higher numerals 70, the pivot point 72 moves further away from the point where the support member 30 and insulator button 52 engages the leaf spring 46 thus enabling the leaf spring 46 to flex over a greater distance with a resultant less upward force exerted thereby. An additional leaf spring 74 is provided on collars 56 adjacent the longitudinally extending portion 56 of control member 54 to bias same into engagement with collars 56 to keep the assembly tight and rattle free. A cover 76 is provided to enclose the underside of lower arm 16.

The support structure for upper tool 26 comprises an upper tool support 80 with a threaded depending stud segment 82 thereon. A nut 84 threaded onto stud portion 82 clamps an electrical cable 86 to the upper tool support structure 80.

Figure 2:
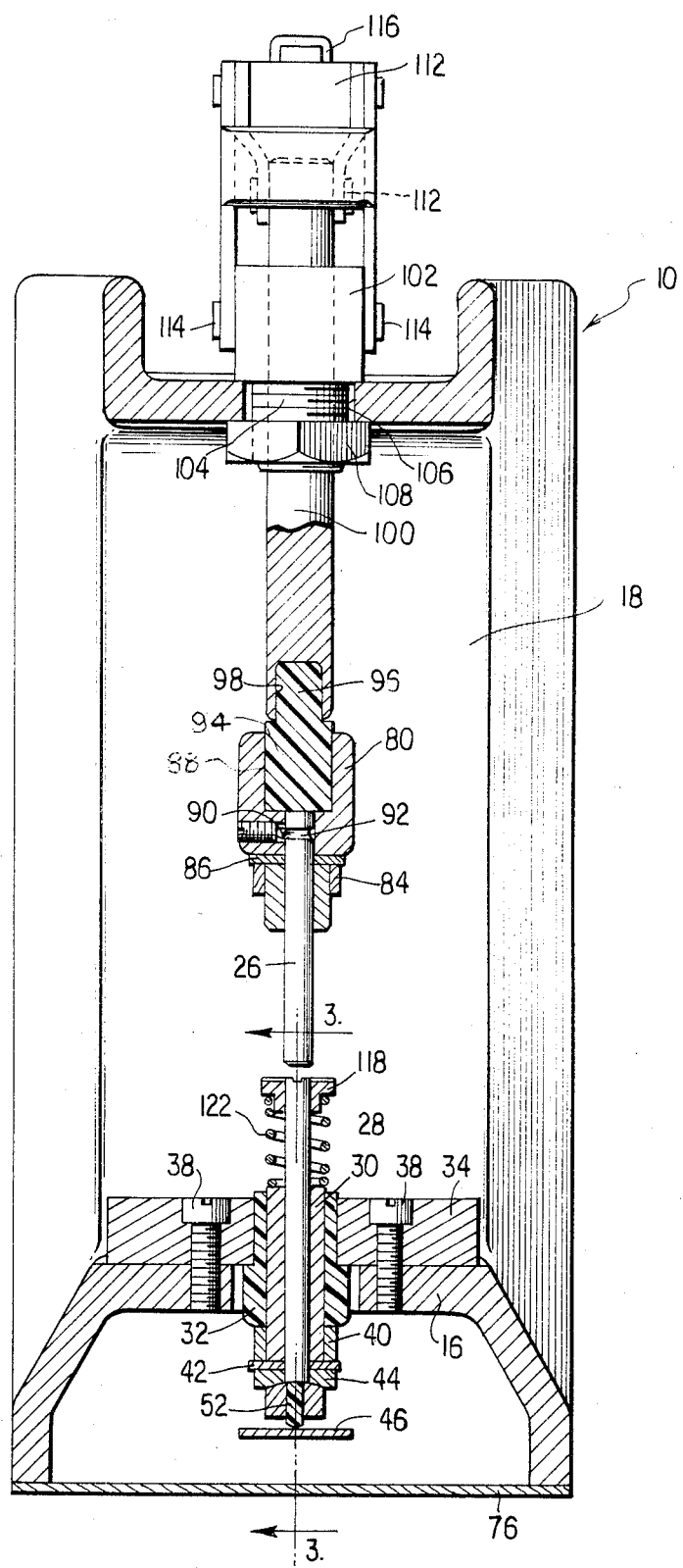
FIG. 2 is a front elevational view taken along the lines 2—2 of FIG. 1.

As may be seen in FIGS. 1 and 2, tool support 80 is provided with a non-threaded control aperture 88 with a reduced size lower portion closely fitted to the shank of upper tool 26. A spring loaded detent ball 90 serves to engage a groove 92 in the upper tool 26 to lock same inside the lower portion of aperature 88. An insulator spindle 94 of plastic-like material has one end cemented into central aperature 88 and has a threaded segment 96 connected to a correspondingly threaded aperature 98 in a tool support rod or mandrel 100 to thereby electrically insulate the upper tool support 80 from the frame 12. The mandrel 100 slidably extends through a bushing 102 which has a threaded end 104 and is held in an aperature 106 in upper arm 16 by means of a nut 108.

A conventional toggle mechanism 110 is pivotally secured at 112 to the top of mandrel 100 and at 114 to the sides of the upper arm 14 on frame 12. Preferably, the toggle mechanism 110 is of the double locking push-pull type illustrated in the drawing, and for example, may be the same as is described in U.S. Pat. No. 3,237,463. The stopping point of handle 116 which corresponds to the maximum downward movement of upper tool 26 may be set according to the relative position of tools 26, 28 so that the toggle actuator structure cannot force lower tool 28 downward past the spring force limit of leaf spring 46 and control member 54 thereby avoiding damage to the machine or tools.

The eyeletting machine may be operated on any flat work surface by placing either flat surface 20, 22 adjacent thereto. The electric cables 42, 86 can be connected to a conventional source of high amperage such as a welding unit or they may be connected to a self-contained high amperage power source such as a step down transformer which is energized for a preselected duration by way of a timer (not shown) to provide a stand-alone machine that can be plugged into a conventional electrical outlet of 110/220 volts.

Preparatory to operation of the machine 10, the lower tool 26 of required size is inserted in the support member 30 and an upper tool 26 of corresponding size is inserted in tool support 80 until the detent ball 90 engages the groove 92. A stripper accessory 118 comprises a plastic annulus 120 with a flat upper surface therein and a helical spring 122 secured to the plastic annulus 120. Stripper 118 fits around the lower tool 28 as shown in FIGS. 1 and 2 with its flat upper surface horizontal with the tip end of lower tool 28 and coil spring 122 resting adjacent the top of support member 30. The purpose of the stripper 118 is to level or square a workpiece on tool 28 so that the eyelet, funnelet, etc., may be seated and aligned on the workpiece prior to contacting tool 28. During setting operation of machine 10, stripper accessory 118 is forced downward and its presence does not affect actual operation of tools 26, 28. The stripper 118 may be removed if insufficient space is present on the workpiece.

Figure 5:
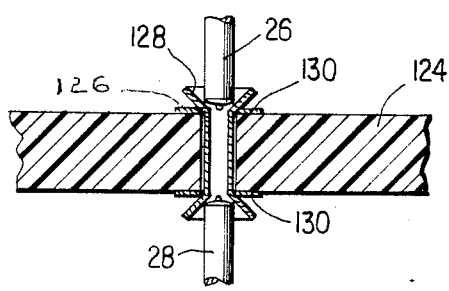
FIG. 5 is an enlarged cross-sectional view of a printed circuit board and eyelet being set therein.

Referring not to FIG. 5, a workpiece such as a printed circuit board 124 having an eyelet hole 126 already therein is disclosed. A preinserted eyelet or funnelet 128 is loosely positioned in hole 126 with its preformed head up. The eyelet 128 and workpiece 124 are moved to a position between upper and lower tools 26, 28 and the eyelet 128 is located adjacent upper tool 26. As toggle linkage 110 is moved from the open position shown in phantom lines in FIG. 1 to the close position shown in solid lines, it lowers upper tool 26, the eyelet 128 engages lower tool 28, and upsetting and cold setting occurs. Full movement of the toggle mechanism 110, because its travel has been preset, will not damage the machine, however, the pressure exerted by leaf spring 46 may be insufficient to swadge the eyelet to a degree that it will not rotate in the hole 126. Thus, the control member 54 may have to be moved further to the left as viewed in FIG. 1 thereby changing the location of pivot point 72 and increasing the force exerted on the support member 30 by leaf spring 46 as aforedescribed. When the setting represented by numerical indicia 70 is just right so that the eyelet 128 does not rotate in hole 126, the setting or number 70 is noted for a given size eyelet 128, this enables the machine 10 to be rapidly reset to exert an exact amount of force to cold set various size eyelets 128 merely by moving the pointer 66 to the noted number 70.

After the eyelet or funnelet, etc., 128 has been upset to be just tight enough not to rotate in hole 126, the pointer setting 66 is noted if this is a first time the machine has been used for this particular size eyelet, and a suitable electric current is caused to flow in electric cables 42, 86 perferably for a timed duration. The eyelet or funnelet is then fused to the pad 130 on the printed circuit board or workpiece 124 by the electrically generated heat. The size of the upper and lower tools 26, 28 can be supplied in numerous sizes for different size eyelets or funnelets.

Applicant has thus described in detail his novel fused eyeletting machine which is capable of having the cold setting force exerted on a particular size eyelet or funnelet preset to a specific, predetermined amount thus enabling the machine to be rapidly set up to fuse eyelets or funnelets as their sizes change.

We claim:

1. A portable machine for setting eyelets and the like comprising:
    (a) a C-shaped frame adapted to rest on a work surface, said C-shaped frame having a lower arm and an upper arm,
    (b) a lower tool resiliently mounted in an aperture in the lower arm of the frame, said lower tool movable relative to said lower arm,
    (c) an upper tool opposing said lower tool, said upper tool movably mounted on the upper arm of the frame, said upper tool having a tool mount for said upper tool including an aperture in said upper arm and a mandrel extending therethrough, said upper tool being secured to said mandrel forming a linear extension thereof,
    (d) toggle means pivotably mounted on said upper arm of said C-shaped frame and the uppermost portion of said mandrel for moving said mandrel and upper tool into setting engagement with said lower tool, and
    (e) tool support structure underlying and resiliently supporting said lower tool from beneath the aperture in said lower arm, said tool support structure comprising
    elongated biasing means, having a longitudinal axis, mounted on said lower arm for exerting an upward force on said lower tool, said biasing means comprising a first longitudinal portion fixedly connected to said lower arm and a second longitudinal portion bendably movable relative to said lower arm, a pressure control means movably mounted on said lower arm for predetermining a maximum setting pressure applied to a workpiece by said opposed upper and lower tools, said pressure control means being movable in a direction parallel to said longitudinal axis of said biasing means, said pressure control means having a fulcrum edge movable relative to said second longitudinal portion of said biasing means, said second longitudinal portion of said biasing means abutting against said fulcrum edge to provide said predetermined setting pressure, and pressure indicating means connected to said pressure control means for indicating said predetermined maximum setting pressure.

2. The machine of claim 1 wherein said upper and lower tools are removably mounted and said upper tool is held in said upper tool mount by detent means.

3. The machine of claim 1 wherein a stripper member is removably positioned concentrically of said lower tool for leveling and positioning a workpiece relative to the tools.

4. The machine of claim 1 wherein an electrical insulating tool support means is provided for mounting each tool therein, said upper tool being thereby electrically isolated from said mandrel and said lower tool being thereby electrically isolated from said lower arm; and wherein electrical cables are secured directly to said tool support means in electrical connections with said tools.

5. The machine of claim 4 wherein said lower tool support further comprises a cylindrical insulator bushing disposed in the aperture on said lower arm and a centrally apertured metallic member wherein said lower tool seats, said metallic member being disposed inside the insulator bushing and extending therethrough to beneath the apertured portion of said lower arm, the electrical cable connection being made to said metallic member at a location thereon beneath the apertured portion of said lower arm.

6. The machine of claim 1 wherein said C-shaped frame has a back section connecting said upper and lower arms and both said back section and said lower arm have areas adapted to permit said C-shaped frame to be positioned on said work surface.

7. The machine of claim 1 wherein said biasing means includes a leaf spring mounted at one end on said lower arm and having the other end in engagement with said lower tool, said pressure control means being slidably mounted on said frame adjacent said leaf spring, said leaf spring abutting against said fulcrum edge to provide said maximum setting pressure.

8. The machine of claim 1 wherein said pressure indicating means includes indicia means on said lower arm with graduations representing various pressure settings and said pressure control means has pointer means formed therewith movable relative to said indicia means.

* * * * *